United States Patent [19]

Seman

[11] 4,443,685
[45] Apr. 17, 1984

[54] FIXTURE FOR LASER SCRIBING (OF DENDRITE SILICON CELLS)

[75] Inventor: Edward J. Seman, Elizabeth Township, Allegheny County, Pa.

[73] Assignee: Westinghouse Electric Corp., Pittsburgh, Pa.

[21] Appl. No.: 349,570

[22] Filed: Feb. 17, 1982

[51] Int. Cl.³ .............................................. B23K 27/00
[52] U.S. Cl. ........................ 219/121 LH; 219/121 LJ
[58] Field of Search .................. 219/121 LH, 121 LJ, 219/121 LG, 121 LN; 136/258; 29/583

[56] References Cited

U.S. PATENT DOCUMENTS

| | | | |
|---|---|---|---|
| 3,916,510 | 11/1975 | Martin | 29/583 |
| 4,273,950 | 6/1981 | Chitre | 219/10.55 R X |
| 4,311,870 | 1/1982 | Frosch | 219/121 LN X |
| 4,345,967 | 8/1982 | Cook | 156/613 |

*Primary Examiner*—C. L. Albritton
*Attorney, Agent, or Firm*—Z. L. Dermer

[57] ABSTRACT

A fixture and a method for holding and aligning dendritic web silicon cells during laser scribing to delineate the cell from the dendrites, and includes a see-through support on which the cell is placed face down for viewing of a grid structure within an optical-receiver transmitter having an outline pattern thereon within which the grid structure is viewed for alignment of the cell on the support so that the cell can be laser scribed on the back between the grid structure and the dendrites and along the width dimension so that a predetermined spacing is maintained between the outer edges of the cell encompassing the perimeter of the grid structure.

18 Claims, 8 Drawing Figures

FIXTURE FOR LASER SCRIBING (OF DENDRITE SILICON CELLS)

CROSS-REFERENCE TO RELATED APPLICATIONS

This disclosure makes use of the disclosure concerning patent application Ser. No. 349,721 directed to Fixture for Large Cell Dendrite Removal filed concurrently herewith in the name of E. J. Seman further identified by Attorney Docket No. 49,556, which is hereby incorporated by reference.

BACKGROUND OF THE INVENTION

This invention is concerned with a fixture for laser scribing of dendritic web silicon cells. More particularly, the invention is concerned with a fixture which is used to scribe a laser line onto a dendritic web silicon cell without damaging the components thereof while assuring uniformity from one cell to another while providing for a minimimum of waste consonant with manufacturing techniques adaptable from one state to another.

Conventionally, a dendritic web solar cell is made on strips of single crystal silicon, and the two edge portions which extend along the longitudinal length form dendrites which are to be removed. The cell is typically a p-type (positive type) silicon base material which has a metallized rear contact and a front n-type diffused layer on the silicon base to form a p-n junction. The front of the cell is a metallized electrical contact grid structure (for collecting electrons), and the cell upon exposure to sun produces oppositely charged electrons (−) and holes (+) with the electrons being collected by the grid structure and taken by a wire from the contact grid structure and the holes (+) through a wire on the metallized rear face to transmit current to an external load circuit. The dendrites are formed at the longitudinal edges of a web in a dendritic web process.

A silicon web is formed by the solidification of a liquid film supported by surface tension between two silicon filaments, known as dendrites, which border the edges of the growing strip containing the p-type silicon base.

While costly finishing steps are not required for solar cells made from the dendritic web process, it is still necessary to remove the dendrites at the edges even though the other costly steps of slicing, lapping and polishing are not required. The electrical grid structure is a very fine and precise copper circuit which is electroplated over a thin evaporated titanium, palladium, and silver layer, and once so formed, an improper or a slightly inaccurate cut will mar the face of the cell and destroy the electrical circuit if the copper is cut thereinto. Care also must be exerted so that the p-n junction is not damaged.

Laser scribing has been found to be the most cost-effective because a diamond scribe can cause damage to the cell. Laser scribing is a shallow cut which does not cut through the cell and which provides a sufficient separation such that the dendrites can be easily and cleanly severed from the solar cell.

The invention is more particularly concerned with one of the intermediate stages in the complex process of processing the dendritic web matrix ribbons into dendritic web solar cells, and then having the dendrites removed so that the solar cell can be used as one of the component cells which is placed into a solar panel. More particularly, the invention is directed to the process and apparatus for laser scribing the back or rear face of the cell so that the dendrites can be removed by means of a process and fixture for large cell dendrite removal such as that disclosed in my application as set forth in Attorney Docket 49,556, or equivalent.

The most efficient technique in the process of removing the dendrites is to scribe the periphery of the cell from the back using laser radiation. After scribing, the cells can be separated from each other and the dendrites can be removed from the cell by fracturing the material along the scribe line to remove the dendrites.

DESCRIPTION OF THE PRIOR ART

In order to remove the dendrites as noted heretofore, it is necessary to scribe a line between the dendrites at the edge of the cell and grid forming part of the cell. Further, it has been found that a laser is useful for this purpose, and a laser scribe has heretofore been used. As noted heretofore, a conventional diamond scribe is not considered to be usable because it would tear the metal on the back of the cell. Diamond scribing on the front of the cell lowers or destroys the efficiency of the cell. It has been found that it is better to leave the front of the cell alone because anything done to the front of the cell can damage the electrical p-n junction.

Heretofore, one known system of laser scribing employs a fixture and a method which has been used to laser scribe the back of the cell, is the "QUONTRONIX 604 Laserscribe". This unit uses a television camera which is used to align the back of the cell with the laser beam. While this device is quite useful, it requires a considerable amount of time to accomplish the necessary laser scribe alignment. Moreover, this equipment also requires the use of a television camera and a television screen for viewing, two expensive pieces of equipment which are not necessary with my invention.

A solar cell is generally rectangularly-shaped and is substantially 2 cm wide and 9.4 cm in length. Cutting methods require a distance from the grid circuitry of at least ½ mm for the scribe line to assure that there is no grid circuit or p-n junction damage.

SUMMARY OF THE INVENTION

The present invention proposes another system providing a fixture which is more facile to use and free of some of the difficulties and problems of the heretofore known laser scribe systems.

Such a fixture consists of a frame, preferably plastic, with an upper, see-through support, and a lower angulated mirror so that the problem of the upper support is reflected to the front of the fixture. As the exposed face of the cell is placed front-face down onto the upper see-through support, the angulated mirror reflects the front face of the cell with the dendrites attached thereto to the front of the fixture. Accordingly, a length of the dendritic web, on which one or more solar cell structures have been defined by a metal pattern is placed upside down on the frame and a mirror-image direct view is provided to the operator or viewer. This pattern is seen and viewed directly as a reflection.

The solar cell is preferably held in place by a vacuum hold down although other hold down means may be used. By observing the grid structure in the mirror, the viewed face of the grid along a longitudinal length thereof is aligned with a set of two alignment lines which intersect each other. The two alignment lines can be in the form of a pair of lines which intersect to define a corner of the cell connecting a line which coincides with a width edge of the cell and a line which coincides with a length edge of the cell. With these two lines of alignment, the cell is positioned with respect to predetermined cutting lines and a starting cutting point has also been predetermined. Thus by aligning a focused laser to cut down along a predetermined cutting line, one edge of the cell has been defined. A scribe perpendicular to the first cutting line is now made along the width dimension of the cell. Once the grid structure on the front face of the dendritic web silicon cell has been located with two edges of the grid structure aligned with the pair of intersecting lines, the fixture together with the dendritic web silicon cell which is held thereon is moved past a laser beam in accordance with a predetermined pattern to laser scribe the back of the cell. While the back scribing takes place on the rear face of the cell, the laser scribed lines formed at the rear of the cell are spaced ½ mm from the grid pattern formed on the front of the cell, if in fact the laser were to cut completely through the front face of the cell.

Once the dendritic web silicon solar cell or cells are aligned on the fixture and held thereto, the fixture and cells are held thereto, the fixture and cells are moved as a unit along a computer controlled path passed the laser beam to produce predetermined laser scribe lines or cuts on the rear face of the cells.

This process can be repeated for other cells on the same strip. The strip may consist of a single cell or a plurality of cells, such as for example three cells disposed lengthwise on the strip with individual cells being separated from each other after being laser-scribed. The movement of the web can be facilitated using the normal length-width motion available in a holder which can be used with the fixture of the invention. Since as pointed out heretofore it is necessary to scribe the web material from the back, the outline of the cell and the grid structure thereon are not visible to the operator, the use of the fixture according to the invention has improved the scribing of the cells to perform an accurate scribe in the following ways: all cells are cut to a uniform size; the scribing process is rapid since all alignment is done just prior to the scribing; and, cells of any size can be scribed without special fixturing.

To these ends, the invention consists in the provision of a fixture for holding and aligning a dendritic web silicon cell during laser scribing to delineate the cell from dendrites along the longitudinal edges thereof, and includes a support supporting the dendritic silicon cell for alignment with a predetermined pattern or at least a portion thereof which is to be scribed onto the dendritic web silicon cells to delineate the cell from the dendrites and to provide for a preselected longitudinal length of the cell, together with an optical receiver-transmitter mechanism associated with the cell support for visually viewing the predetermined pattern and the portion of the dendritic silicon cell which is to be delineated from the dendrites so that a laser scribe line can be used to provide a separation mark between the cell and the dendrites.

The cell support is formed of a clear see-through material and is provided with at least two cell indicia markings on the surface thereof co-extensive with at least a portion of the length and a portion of the width of the cell after the dendrites are removed and the cell is cut to its predetermined length; and the optical receive-transmitter mechanism includes a mirror angulated in the fixture relative to the support for viewing the grid structure on the cell when placed onto the support surface with its grid structure facing thereto, so that the cell can be aligned on the support surface when the grid structure is aligned within or with and co-extensive with pre-drawn lines reflected on the mirror, and other cell indicia markings may also be used which are visible in said mirror.

The invention is also concerned with a method for applying laser scribe lines to form a pattern on the back of dendritic web silicon cells having on the front thereof a face portion with the grid structure thereon to provide for cells of uniform length and width and to provide a separation mark between the grid structure and the dendrites, which includes aligning the cell having the grid structure appropriately located while viewing the face of the cell with the grid structure thereon from its face down position so that the dendritic web silicon cell can be laser scribed in accordance with a predetermined pattern which is spaced at all times from the grid structure to provide cells of uniform length and width with the dendrites outside the predetermined pattern.

Preferably, the predetermined pattern is scribed along the longitudinal extent and width extent of the cell approximately ½ mm from the grid structure.

The invention is also usable in connection with dendritic web silicon cells which have a repeating grid structure along the front face with a free space between each pair of repeating structures. The laser can be used to laser scribe a line in the free space between adjacent grid structures for providing a delineated separation adjacent grid structure. The fixture is also provided with a separate vacuum hold down for each individual cell so that the cells with the repeating grid structure can be held down while laser scribing. The vacuum hold down is also used with the dendritic web silicon cells having a single grid structure thereon.

Once the dendritic web silicon cell with the dendrites thereon is properly aligned, laser scribing can then be performed by any suitable means, such as a computer controlled x-y transporter which is programmed in accordance with he outline pattern on the surface of the support surface as well as the grid structure on the front face of the cell to move the fixture and dendritic web silicon cell structure with one or more cells passed the laser scribe to make the necessary laser scribes or separation markings.

BRIEF DESCRIPTION OF THE DRAWINGS

The advantages, nature and additional features of the invention will become more apparent from the following description, taken in connection with the accompanying drawings, in which.

DESCRIPTION OF THE PREFERRED EMBODIMENT

Figure 1:
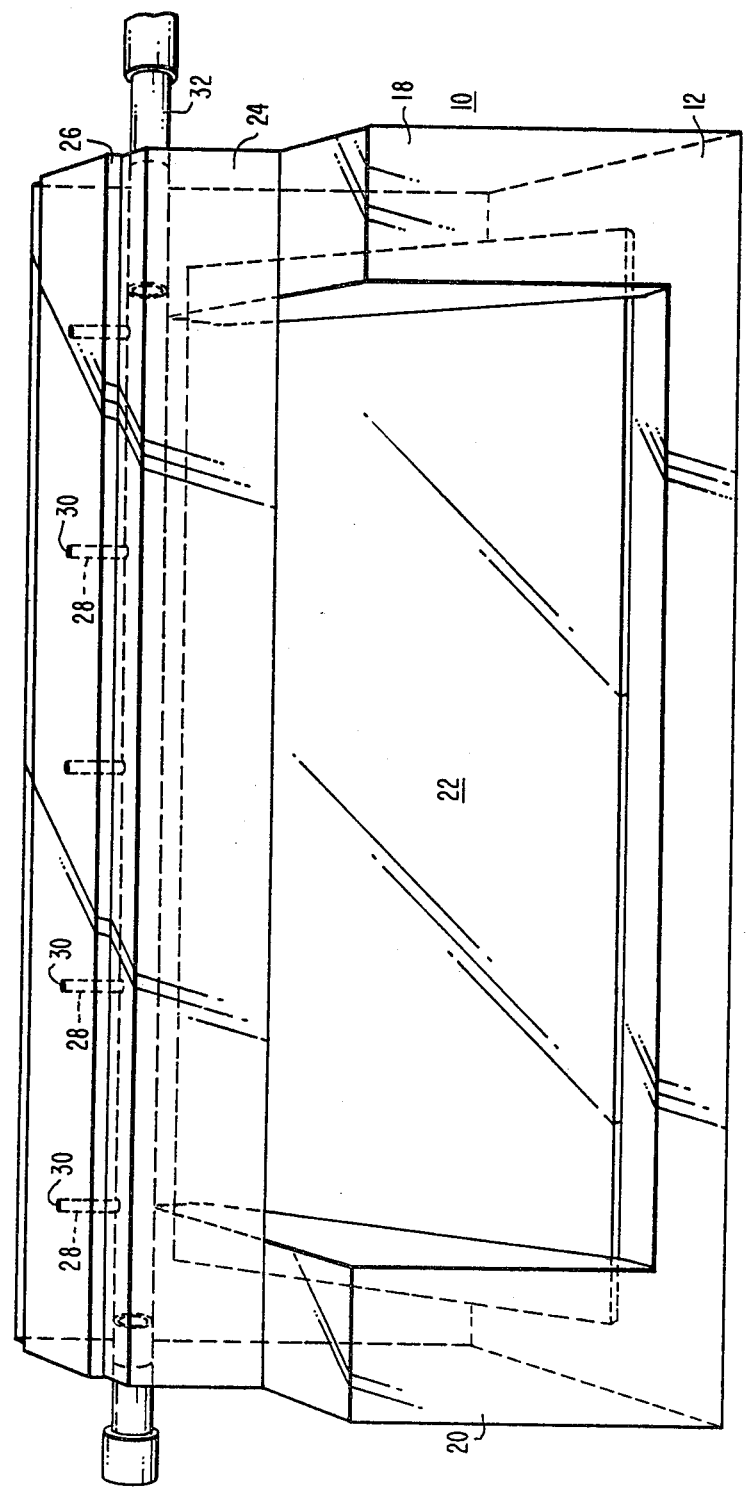
FIG. 1 is a front perspective view of a fixture according to the invention for laser scribing of dendritic web silicon cells having dendrites which are to be removed.

Referring now more particularly to the drawings that illustrate the presently preferred mode of carrying out the invention, reference numeral 10 indicates a fixture useful to laser scribe a dendritic silicon solar cell C; the fixture 10 is supported on an x-y transporter T (FIG. 8) for movement past a source of laser radiation LR in an X and a Y or length and width direction.

Figure 2:
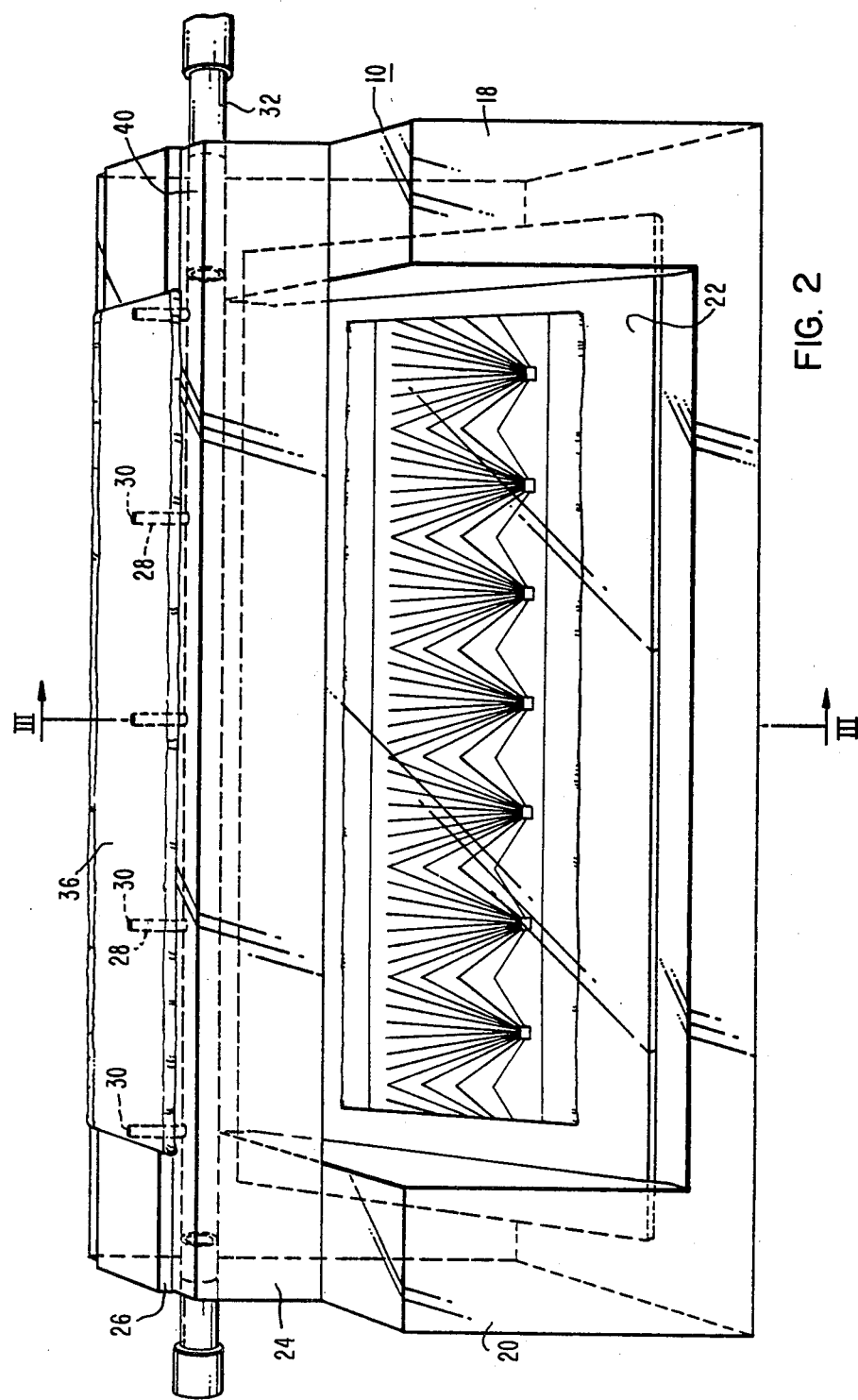
FIG. 2 is a front perspective view of the fixture of FIG. 1 with a dendritic web silicon cell placed on a top portion or upper support thereof, and with the front face of the dendritic web silicon cell having the electrical grid construction shown in a mirror forming part of the fixture and angularly inclined relative to the front thereof as well as the upper support.
Figure 3:
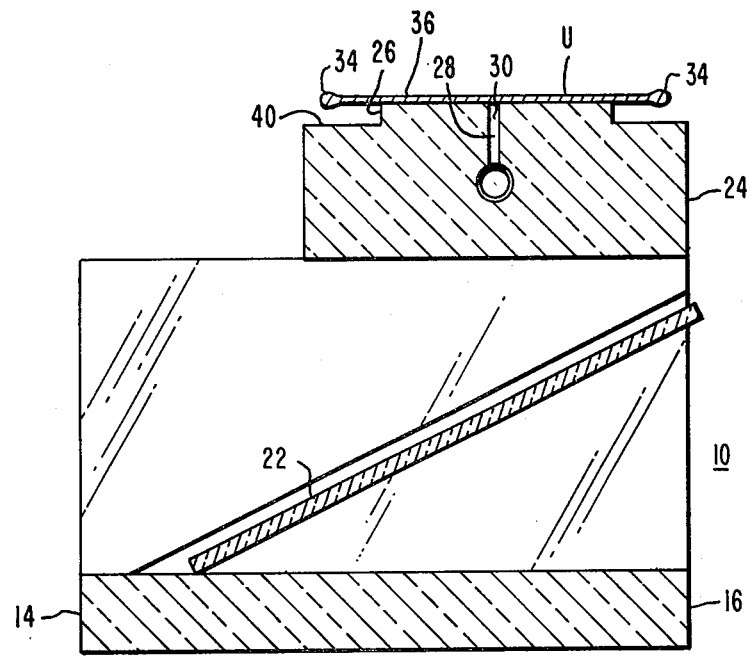
FIG. 3 is a sectional view taken on line 3—3 of FIG. 2.

As best seen in FIGS. 1, 2 and 3, fixture 10 is formed of clear glass or clear plastic or any clear see-through material having structural rigidity and includes a support base 12, front and rear portions 14 and 16, respectively and vertically upstanding side portions 18, 20. Positioned between side portions 18, 20 and supported between base 12 and rear portion 16 is a mirror 22 inclined at an angle of approximately 30 degrees to the horizontal of fixture 10 and transporter T. Positioned between side portions 18, 20 above mirror 22 is a top portion 24 provided with a pedestal 26 which projects and extends above top portion 24. A source of vacuum V applies a vacuum to pedestal 26 through top portion 24 by means of auxiliary conduits or channels 28 which extend vertically through top portion 24, pedestal 26 and opens at openings 30 through pedestal 26, preferably at the longitudinal center thereof. Auxiliary conduits 28 are connected to the vacuum supply source V by means of main conduit or pipe 32. The vacuum supply source is a conventional source of vacuum and is not shown.

Figure 4:
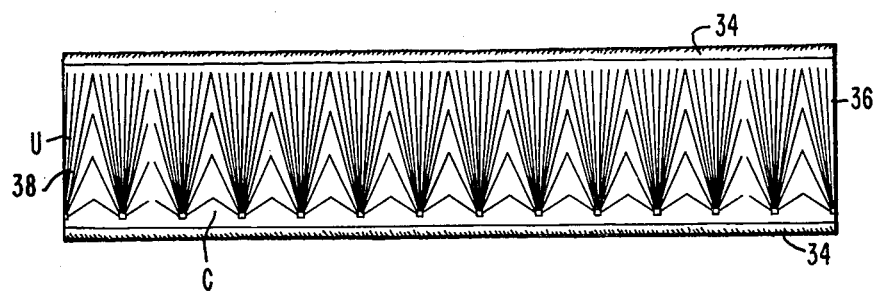
FIG. 4 is a perspective view of a dendritic web silicon solar cell unit or structure with the dendrites at the two longitudinal edges of the cell unit; the dendritic web silicon solar cell is shown in its form prior to the laser scribing thereof to demarcate the portion of the silicon solar cell unit containing the electrical grid structure from the dendrites which are to be removed, and a grid structure is also shown discontinuous along the longitudinal length of the cell unit to indicate the predetermined length of the individual cells of the aforesaid unit which are to be used to form a solar panel; the cell unit is shown for explanatory purposes as containing three solar cells with the dendrites to be removed at the longitudinal edges, but the cell unit can be formed as a single solar cell which is to be laser scribed or formed as a composite unit consisting of more than three solar cells, as well as solar cells with different sized grid patterns thereon, although not shown for the sake of simplicity.
Figure 5:
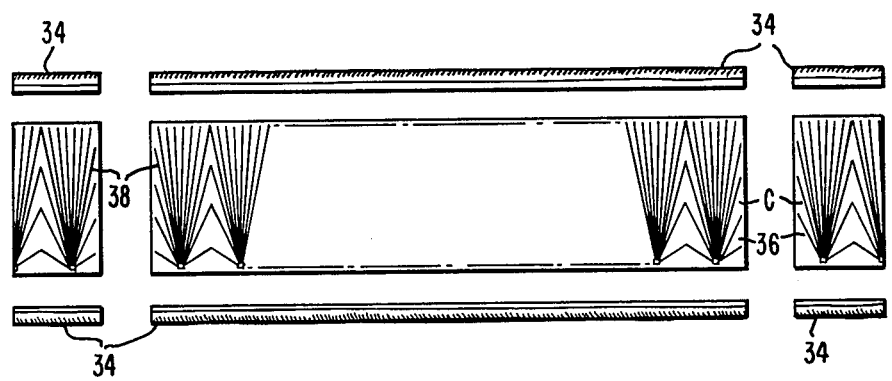
FIG. 5 is a perspective view of the composite cell unit of FIG. 4, after it has been laser scribed according to the invention and after the dendrites have been separated and the adjacent cells forming the cell unit have been separated from each other by conventional means or in accordance with the disclosure set forth in my patent application referred to heretofore and identified by Attorney Docket No. 49,556.
Figure 6:
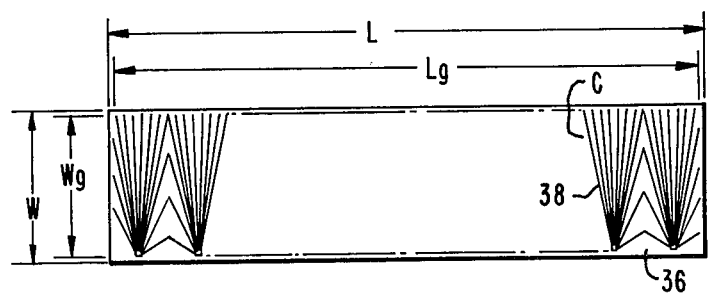
FIG. 6 is a flat plane projection of a solar cell illustrating the spacing of the grid structure from its perimeter edges.

Referring now more particularly to FIGS. 4 to 6 of the accompanying drawings, a dendritic web silicon cell unit U with a grid structure 38 thereon is shown in FIG. 4 as an integrated whole prior to laser scribing and as separate solar cells C in FIG. 5 after laser scribing and severing to form the individual cells C. A single solar cell C is shown in FIG. 6 without the grid structure 38 which has been omitted for the sake of clarity as the cell C is being viewed from the rear thereof.

The solar cell unit U may be formed as a structure with three cell units or as a single cell unit each with dendrites 34 which are to be removed from a dendritic web matrix 36 to form the individual solar cells C with the grid structure 38 thereon.

As best seen in FIG. 6, a solar cell C after the dendrites 34 have been removed has a length L and a width W, with grid structure occupying an area encompassed by a long or length dimension Lg and a narrow or width dimension Wg. With the laser scribing method according to the invention and the use of fixture 10 and transporter T or equivalent it is possible to achieve a spacing between the grid structure 38 and the perimeter edges of cell C of $\frac{1}{2}$ mm to provide for a substantial minimum spacing between the perimetral edges of the cell and the grid structure 38 on the front face thereof. While a particular cell structure and grid structure on the front face has been shown and described, other cell structures of different dimensions with different grid structure dimensions can be made.

As best seen in FIGS. 2 and 3, pedestal 26 is raised above a top face 40 of top portion 24 so that the dendrites 34 can overlie pedestal 26 and permit the center portion or the dendritic web matrix 36 to lie flat on top of pedestal 26. The center portion 36 is held to the fixture 10 and pedestal 24 by the vacuum applied to the underside of the cell unit U through openings 30.

Figure 7:
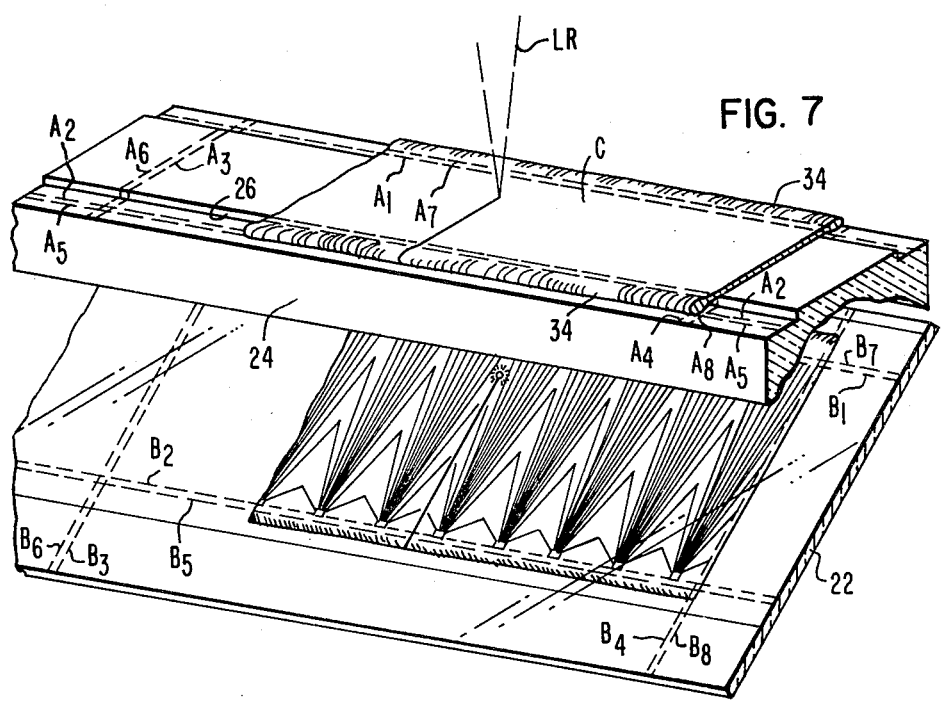
FIG. 7 is a perspective view of the fixture shown in FIG. 1 showing a top portion with a dendritic web silicon cell in place thereon so that it can be laser scribed and the angulated mirror of the fixture with the front face of the dendritic web silicon cell with the grid structure thereon reflected in the mirror as viewed by an observer, all as shown in FIG. 2; and, FIG. 8 is a front perspective view of an x-y transporter on which the fixture of FIG. 1 with the dendritic web silicon cell unit is supported as shown in FIG. 2 for moving the fixture and dendritic web silicon cell or cell unit held thereon passed the laser beam after adjustment of the fixture to align it with the laser beam to provide for the appropriate predetermined laser scribe to be made on the rear of the dendritic web silicon cell or cell unit.

Referring now more particularly to FIG. 7 of the accompanying drawings, the pedestal 26 together with top portion 24 (schematically shown) and mirror 22 are shown as separate elements removed from fixture 10 and provided with certain predetermined indicia markings thereon, designated with the prefix A on top portion 24 and pedestal 26 and the prefix B on mirror 22. The markings B on the mirror 22 are reflections thereon of the indicia markings A on the top portion 24 or pedestal 26. When indicia markings A are referred to, these are intended to indicate those markings on top portion 24, and pedestal 26. When the indicia markings A are received by mirror 22 and reflected thereby to a viewer of mirror 22, they are designated with the prefix B.

As noted heretofore, it is necessary to scribe the dendritic web silicon cell from the back, and because the actual physical outline of the grid structure 38 on the front of the cell cannot be seen by the laser scribe operator, the alignment of the cell must be done with precision and accuracy that can be repeated.

FIG. 7 further shows cell C supported on pedestal 26 with the dendritic portions 34 supported above top portion 24 and extending in the width direction beyond the width of pedestal 26, dashed lines $A_1$ and $A_2$ locate opposite sides of the grid structure along the long dimension Lg and dashed lines $A_3$ and $A_4$ locate the opposite sides of the width dimension Wg. Dashed line $A_5$ is spaced approximately ½ mm from line $A_2$ and outside the grid structure 38 but between one of long perimeter lines of the grid structure and the dendrite 34 adjacent thereto. Line $A_6$ is a dashed line transverse to and perpendicular to line $A_5$ and spaced from line $A_3$ approximately ½ mm and lies outside the grid structure 38.

Lines $B_1$ and $B_2$ are reflections of lines $A_1$ and $A_2$ on the mirror and indicate two longitudinal lines between which the grid 38 is to be placed as viewed by the operator in the mirror. Lines $B_3$ and $B_4$ are reflections of dashed lines $A_3$ and $A_4$, respectively on mirror 22 and indicate two lateral lines along the width dimension between which the cell 38 is to be placed. The spacing between lines $B_1$ and $B_2$ is equal to $W_g$ and the spacing between lines $B_3$ and $B_4$ is equal to $L_g$. Line $B_5$ which is shown below line $B_2$ is a reflection in mirror 22 of line $A_5$ and indicates one line along which the back of the cell is laser scribed and line $B_6$ is a reflection of line $A_6$ on mirror 22 and indicates another line normal to line $B_5$ along which the cell is to be laser scribed. Line $B_8$ is a reflection of line $A_8$ in mirror 22 and indicates another line along which the back of the cell is to be laser scribed and is spaced ½ mm from the perimeter of the grid structure.

Once the grid structure 38 is located, as viewed in mirror 22 between lines $B_1$ and $B_2$, and between lines $B_3$ and $B_4$, the grid structure and the cell C, or cell unit U if a plurality of cells are provided, on the dendritic web silicon (cell(s), then the transporter T is coordinated with the laser beam or radiation LR to scribe a line along line $A_5$ or line $B_5$ as viewed in mirror 22. The transporter T moves the cell C longitudinally along line $B_5$ passed the laser beam LR and then orthogonally along line $B_6$ and then along a line $B_7$ which is parallel to line $B_5$, but spaced from line $B_1$; the reflection of line $A_7$ is seen in mirror 22 as $B_7$ which acts as an optical transmitter-receiver. Lastly, the transporter T moves the fixture 10 so that it traverses the laser beam LR along line $B_8$.

For the sake of simplicity, it is possible to provide only two indicia lines such as $A_2$ and $A_3$ which in turn are reflected as indicia lines $B_2$ and $B_3$ onto mirror 22, and by coordinating the transporter T with the laser beam LR and providing a suitable computer program for controlling the movement of the fixture 10 to traverse the laser beam LR, the appropriate laser scribes are provided on the rear face of the cell.

Figure 8:
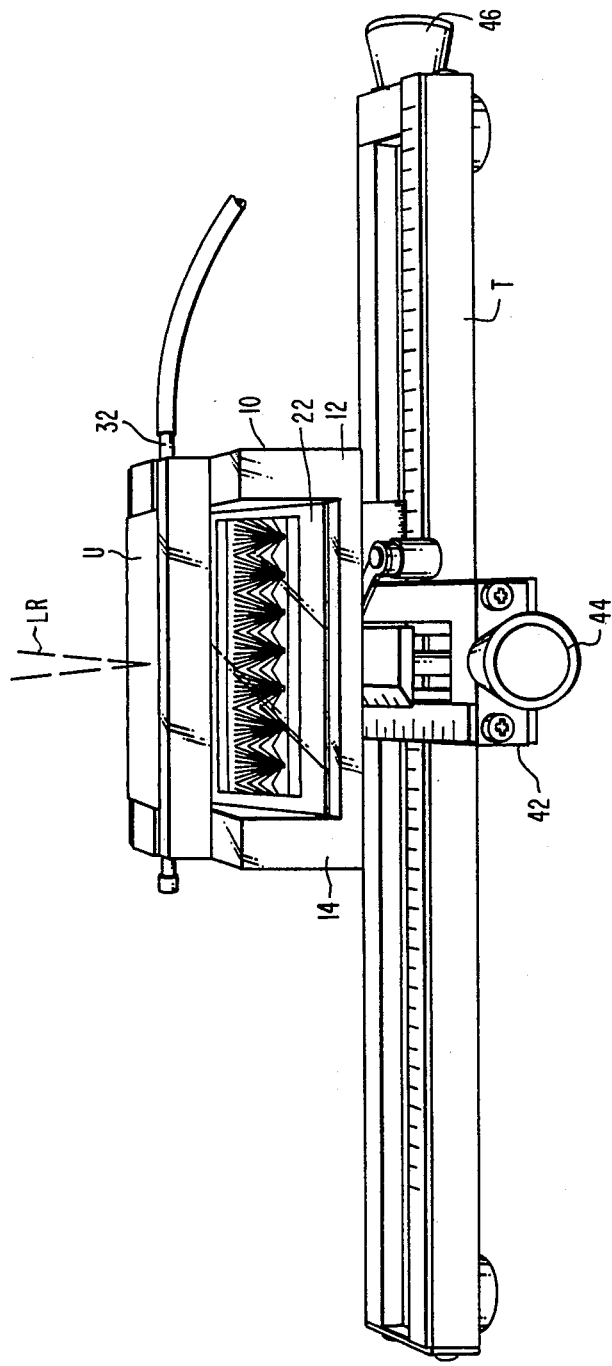

As best seen in FIG. 8, transporter T which supports fixture 10 on an x-y movable carrier 42 includes control knobs 44 and 46 to move the carrier 42 so the beginning of the movement of the carrier 42 takes place at the intersection of lines $A_5$ and $A_6$ (see FIG. 7 for example). The transporter T with the fixture 10 thereon and the laser beam LR may be prefocused so that the starting point of the laser beam is at the intersection of lines $A_5$ and $A_6$, and the point of intersection of lines $B_5$ and $B_6$ on mirror 22 so that the fixture may be moved along lines $B_5$, $B_8$, $B_7$ and $B_6$, etc. to provide the laser scribe. Moreover, it is within the scope of the invention that once the grid structure 38 is appropriately located on fixture 10, it is held thereto by vacuum V, and the computer controlled transporter T may start laser scribing from the point of intersection of lines $B_5$, $B_6$, $B_7$ and $B_8$. Once knobs 44 and 46 adjust carrier 42, all that is necessary is the simple and easy hand alignment of the cell C with the grid structure 38 having at least two sides that coincide with lines $A_2$, $A_3$ or $A_3$, $A_4$ or $A_1$, $A_3$, for example.

It is within the scope of this invention to use a computer controlled transporter T together with laser device generally indicated LR and with the optics thereof to align visually the laser beam LR at the point of intersection of lines $A_5$ and $A_6$ with the fixture 10 on transporter T so that transporter T can be moved in a computer controlled path to provide for the appropriate laser scribes. Moreover, it is also within the scope of the invention to have a computer controlled transporter T which when the laser LR is optically aligned with the intersection, for example, of the intersection of lines $A_2$ and $A_3$ to have the transporter so move that the laser scribes are always ½ mm away from the outline of the grid pattern as defined and delineated by lines $A_1$, $A_2$, $A_3$ and $A_4$ or any pair of intersecting combinations thereof to provide for a single point of intersection.

The transporter T is so controlled that it can only move about 1/10 mm in any direction. The laser device as noted heretofore is provided with suitable optics so that once the laser beam and appropriate pair of intersecting lines is aligned, the laser beam LR will provide the required laser scribe from that point on.

As noted, by observing the grid structure 38 in the mirror 22, the grid structure 38 is aligned within the $B_1$-$B_2$-$B_3$-$B_4$ lines and laser scribes are made along indicia lines $B_5$-$B_6$-$B_7$-$B_8$.

While the indicia lines with the prefix A are provided on the top portion 24 and/or pedestal 26, it is within the scope of the invention to have the lines made on mirror 22, but because of the angulation thereof, a calculation will have to be made for different grid structures 38. On the other hand, if a replaceable or interchangeable pedestal 26 is used, the indicia markings A can be coordinated with different grid structures 38 and the programmed laser beam LR and transporter T can be coordinated.

Furthermore, while a preferred spacing of ½ mm for the laser scribe from the perimeter of the grid structure 38 is indicated, other spacings can be easily made with the computer controlled and coordinated transporter T and laser beam LR.

I claim:

1. A fixture for holding and aligning a dendritic web silicon cell during laser scribing to delineate the cell from dendrites along the longitudinal edges thereof, comprising
    means for supporting the dendritic web silicon cell for alignment with a predetermined pattern on said fixture, so that the cell can be scribed to delineate the cell from the dendrites;
    optical receiver-transmitter means associated with said supporting means for visually viewing the predetermined pattern and the portion of the dendritic web silicon cell which is to be delineated from the dendrites so that a laser scribe line can be used to provide a separation mark between the cell and the dendrites.

2. The fixture as claimed in claim 1 wherein said optical receiver-transmitter means includes
    a mirror for viewing said predetermined pattern to adjust relative thereto a grid structure on the silicon cell when the cell is placed onto said supporting means with the face of the grid structure on top of said supporting means.

3. The fixture as claimed in claim 1, wherein said supporting means includes at least one pair of orthogonally related indicia lines thereon to form said predetermined pattern.

4. The fixture as claimed in claim 3, wherein
said optical receiver-transmitter means is a mirror for receiving said pair of orthogonally related indicia lines thereon, and
said predetermined pattern includes indica lines having a width and a length co-extensive with the width and length of the grid structure support means for viewing in said mirror the position of the cell on said support means.

5. The fixture as claimed in claim 1 or 4, wherein said support means includes indicia markings thereon to define the perimeter of a grid structure on the silicon cell and the length and width of the cell after the dendrites have been removed.

6. The fixture as claimed in claim 2, wherein said support means has a cell support surface and is formed of a clear see-through material which is provided with cell indicia markings thereon co-extensive with the length and width of the cell after the dendrites are removed and it is cut to its predetermined length; and said mirror is angulated in said fixture relative to said support means for viewing a grid structure on the cell when placed onto said support surface with its grid structure facing thereto and aligned with said predetermined pattern, whereby the cell is aligned on said support surface when the grid structure is aligned with and co-extensive with said predetermined pattern, and said cell indicia markings being visible in said mirror and being spaced approximately ½ mm from said predetermined pattern.

7. Means for coordinating the fixture of claim 1 with a laser scribe to provide laser scribe lines on the rear face of the dendritic web silicon cell to move said fixture with the dendritic web silicon cell thereon to traverse a laser beam for laser scribing of the rear face of the cell, said means including a carrier coordinated with said predetermined pattern and said laser beam for movement of said fixture along an x-y direction to traverse said laser beam.

8. A fixture for holding and aligning a strip having at least one dendritic web silicon cell having a grid structure on the front face thereof during laser scribing to delineate physically the cell from dendrites which are to be removed and to predetermine the length of an individual cell which is to be formed comprising:
a clear see-through support member having grid structure location lines thereon and longitudinal and transverse cell indicia lines marked thereon for delineating the length and width of the cell so that a line can be marked along the width thereof and for delineating the dendrites from the cell so that a laser scribe line can be scribed therebetween; and,
a mirror angularly aligned with said support member for viewing said grid structure lines and said indicia lines on said support member, and means for holding said mirror in fixed angular alignment with said support member so that the face of the cell with the grid structure thereon is visible to a viewer viewing the mirror together with the grid structure lines and said indicia lines marked on said support member, whereby to permit viewing in said mirror the relationship of the grid on the cell to locate the grid with the grid structure lines and indicia lines marked on said support member to position the dendritic web silicon cell on said support member with the grid on said cell being spaced approximately ½ mm from the longitudinal and transverse cell indicia lines on said support.

9. The fixture of claim 8, including
vacuum hold means associated with said support member, said support member having openings therethrough opening towards a face of the cell when it is in place on said support member, said vacuum hold means being connected to a vacuum source for applying a vacuum to the cell to hold the cell onto said support member.

10. The fixture of claim 8, wherein said support member is formed of clear plastic and with said grid location lines interiorly spaced from said cell indicia lines, and both said grid location lines and said cell indicia lines are viewable in said mirror; and said mirror is inclined at an angle of approximately 30° to the horizontal of said fixture.

11. A method for applying laser scribe lines to form a pattern on the back of dendritic web silicon cells having on the front thereof a face portion with a grid structure thereon to provide for cells of uniform length and width and to remove therefrom the dendrites, comprising:
aligning the cell with the grid face portion down on top of a pre-dawn pattern to provide for at least two orthogonally-related indicia lines of a predetermined outer perimeter for a cell having a previously designed grid structure to fit with the aforesaid pattern with the back of the cell exposed and with the dendrites located on one side of one of the orthogonally-related indicia lines of the pre-drawn pattern;
viewing the face of the cell with the grid structure thereon from its face down position while aligning the grid structure with another pre-drawn pattern which is co-extensive with at least two orthogonally-related sides of the grid structure spaced from the first-mentioned pattern; and,
laser scribing the dendritic web silicon cell on the rear face thereof to follow the first-mentioned pattern to provide cells of uniform length and width with the dendrites spaced from both said patterns on the same sides thereof along at least one of said orthogonally related sides.

12. The method of claim 11 including
scribing said first-mentioned pattern along the longitudinal extent and width extent of the cell approximately ½ mm from the grid structure.

13. The method of claim 11, wherein the dendritic web silicon cells have a repeating grid structure along the front face with a free space between each pair of repeating structures, and including laser scribing on the rear face of the cell a line in said free space between adjacent grid structures for demarcating adjacent grid structures.

14. The method of claim 11, including along said first-mentioned pre-drawn pattern
first, laser scribing a line to follow along one of said orthogonally-related indicia lines on the rear face of the cell,
secondly, laser scribing a line along the other of the orthogonally-related indicia lines, and
thirdly, laser scribing a line parallel with each of said previously mentioned orthogonally-related indicia lines.

15. The method according to claim 14, including holding the cell onto a support by applying a vacuum to the grid face portion while aligning thereof within the second-mentioned pre-drawn pattern, prior to laser scribing the cell.

16. The method according to claim 11, including aligning a mirror angularly with respect to the face portion and holding the mirror in fixed angular alignment therewith so that the face of the cell with the grid structure thereon is visible to a viewer viewing the mirror together with the grid location lines following the second-mentioned pre-drawn pattern whereby to permit viewing in the mirror the relationship of the grid on the cell to locate the grid with respect to one of the two orthogonally-related indicia lines to locate the dendrites on a side of longitudinal indicia lines forming part of the first-mentioned pre-drawn pattern opposite to the grid structure with the grid structure being spaced approximately ½ mm from the longitudinal indicia lines.

17. The method according to claim 16, including moving the fixture on a transporter to traverse a laser beam to laser scribe lines automatically along said orthogonally-related indicia lines and along lines parallel thereto.

18. The method according to claim 16, wherein said second pre-drawn pattern is an outline pattern which surrounds the perimeter of said grid structure, and said second pre-drawn pattern is spaced approximately ½ mm therefrom and outside of said grid structure and including aligning the transporter by optically viewing the intersection of two orthogonally-related indicia lines and setting the laser beam for commencement of laser scribing in relation to said intersection.

* * * * *